United States Patent
Cronin et al.

[19]

[11] Patent Number: 6,140,703
[45] Date of Patent: *Oct. 31, 2000

[54] SEMICONDUCTOR METALLIZATION STRUCTURE

[75] Inventors: Wayne A. Cronin, Tempe; Brian L. Scrivner, Mesa; Kirby F. Koetz, Chandler; John M. Parsey, Jr., Phoenix, all of Ariz.

[73] Assignee: Motorola, Inc., Schaumburg, Ill.

[*] Notice: This patent issued on a continued prosecution application filed under 37 CFR 1.53(d), and is subject to the twenty year patent term provisions of 35 U.S.C. 154(a)(2).

[21] Appl. No.: 08/774,304

[22] Filed: Dec. 26, 1996

Related U.S. Application Data

[63] Continuation-in-part of application No. 08/692,361, Aug. 5, 1996.

[51] Int. Cl.[7] .................................................. H01L 23/48
[52] U.S. Cl. ...................... 257/766; 257/761; 257/762; 257/763; 257/707; 257/748; 257/770; 257/779; 257/781; 257/783; 257/782; 257/676; 257/677
[58] Field of Search ........................... 257/766, 761–763, 257/748, 707, 770, 779, 781–783, 676, 677

[56] References Cited

U.S. PATENT DOCUMENTS

| | | | |
|---|---|---|---|
| 4,451,972 | 6/1984 | Batinovich | 29/583 |
| 4,574,470 | 3/1986 | Burt | 29/590 |
| 4,946,376 | 8/1990 | Sharma et al. | 428/620 |
| 5,360,991 | 11/1994 | Abys et al. | 257/666 |
| 5,397,716 | 3/1995 | Anderson | 437/31 |
| 5,731,635 | 3/1998 | Bareither et al. | 257/763 |
| 5,958,607 | 9/1999 | Kim et al. | 428/675 |

FOREIGN PATENT DOCUMENTS

| | | | |
|---|---|---|---|
| 0538019 | 4/1993 | European Pat. Off. | H01L 23/495 |
| 2930779 | 2/1980 | Germany | H01L 21/24 |
| 57-16926 | 10/1982 | Japan | H01L 23/48 |
| 1-152752 | 6/1989 | Japan | H01L 23/50 |
| 7-050377 | 2/1995 | Japan | H01L 23/50 |
| 9311563 | 6/1993 | WIPO | H01L 23/482 |

OTHER PUBLICATIONS

Pfiefer et al., "Ni–7% V/Ag Backmetal Project," Aug. 1992, Motorola Technical Developments, vol. 16, p. 144.

Patent Abstracts of Japan, publication number 01209730, dated Aug. 23, 1989, Inventor Tsuchiya Takafumi.

Pfeifer et al., "Ni–7% V/AG Backmetal Project", Aug. 1992, Motorola Technical Developments, vol. 16, p. 144.

*Primary Examiner*—Mahshid Saadat
*Assistant Examiner*—Matthew E. Warren
*Attorney, Agent, or Firm*—Lanny L. Parker; A. Kate Huffman

[57] ABSTRACT

A high temperature metallization system for use with a semiconductor device (23). The semiconductor device (23) has a multi-layer metallization system (36). An adhesion layer (37) of the metallization system (36) is formed on a semiconductor substrate (20). A barrier layer (38) that contains a nickel alloy is formed on the adhesion layer (37). A protective layer (39) is formed on the barrier layer (38). The barrier layer (38) inhibits solder components from diffusing toward the semiconductor substrate (20) during high temperature processing.

27 Claims, 1 Drawing Sheet

SEMICONDUCTOR METALLIZATION STRUCTURE

This application is a continuation-in-part of prior application Ser. No. 08/692,361, filed Aug. 5, 1996.

BACKGROUND OF THE INVENTION

The present invention relates, in general, to integrated circuits and, more particularly, to integrated circuit metallization systems.

In the manufacture of semiconductor devices, a metallization system is typically formed on a semiconductor die to promote bonding of the semiconductor die to a ceramic or a metal structure such as a leadframe. Generally, the metallization systems are comprised of multiple layers of metal such as layers of chromium, nickel, and gold (CrNiAu), layers of titanium, platinum, and gold (TiPtAu), or layers of titanium, nickel, and gold (TiNiAu). The first layer is generally chromium or titanium because of their ability to bond to semiconductor substrates. In addition, the metal of the first layer serves to couple the second metal layers, e.g., Ni or Pt, to the semiconductor die. A gold protective layer is formed over the second metal layer.

An important use of the metallization system is for bonding the semiconductor die to a leadframe. One technique for accomplishing the bonding step is a solder re-flow process. Because the bonding step is accomplished using a solder re-flow process, the bonded semiconductor-leadframe structure must subsequently be maintained at a temperature lower than the bonding temperature. Otherwise, the semiconductor die will become separated from the leadframe. Thus, subsequent processing steps must be carried out at temperatures lower than the initial bonding temperature. If subsequent processing steps require temperatures higher than the temperature of the solder re-flow process, the integrity of the die attach bond may be compromised. A drawback of prior art metallization systems is that the temperature limit of the die attach bond is very close to or higher than the temperature of subsequent solder re-flow processes.

Accordingly, it would be advantageous to have a semiconductor metallization system having temperature limits that permit high temperature processing after formation of the metallization system. In addition, it would be advantageous to have a metallization system that inhibits dissolution of metals at bonding temperatures.

DETAILED DESCRIPTION OF THE DRAWINGS

Figure 1:
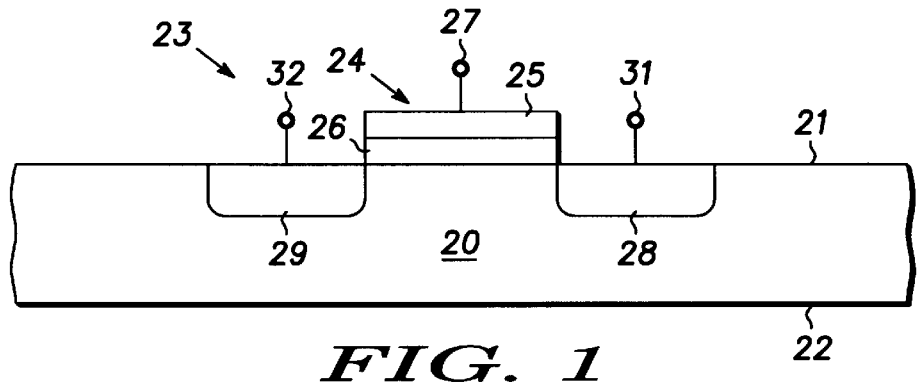
FIG. 1 illustrates a cross-sectional view of a semiconductor device during processing in accordance with the present invention.

FIG. 1 illustrates a cross-sectional view of a semiconductor device 23 during processing in accordance with the present invention. More particularly, FIG. 1 illustrates a semiconductor substrate 20 having a top surface 21 and a bottom surface 22. Suitable materials for semiconductor substrate 20 include gallium arsenide, silicon, silicon-germanium, indium phosphide, or the like. Semiconductor substrate 20 includes a semiconductor device 23 fabricated therefrom. By way of example, semiconductor device 23 is a Metal Oxide Semiconductor Field Effect Transistor (MOSFET) having a gate structure 24 formed on top surface 21. Gate structure 24 includes a gate electrode 25 spaced apart from top surface 21 by a gate oxide 26. A gate terminal 27 contacts gate electrode 25. A source region 28 is adjacent to a first side of gate structure 24 and a drain region 29 is adjacent to a second side of gate structure 24. A source terminal 31 contacts source region 28 and a drain terminal 32 contacts drain region 29. Techniques for fabricating field effect transistors such as semiconductor device 23 are well known to those skilled in the art. It should be understood that semiconductor device 23 is not limited to being a MOSFET. For example, it may be a bipolar transistor, a diode, a Bipolar Complementary Metal Oxide Semiconductor (BiCMOS), a Metal Semiconductor Field Effect Transistor (MESFET), a Heterojunction Field Effect Transistor (HFET), a Modulation Doped Field Effect Transistor (MODFET), or the like.

Figure 2:
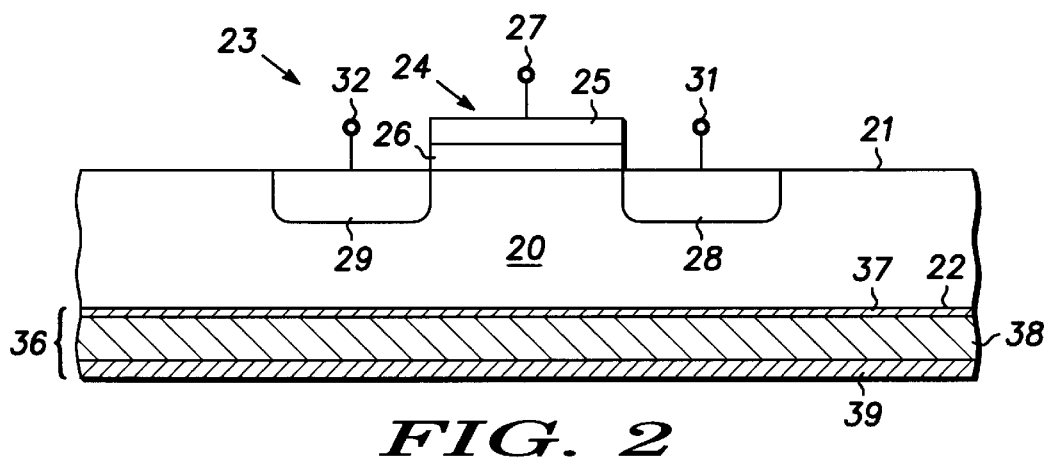
FIG. 2 illustrates a cross-sectional view of the semiconductor device of FIG. 1 having a metallization system formed thereon.

FIG. 2 illustrates a cross-sectional view of semiconductor substrate 20 having a metallization system 36 disposed thereon in accordance with the present invention. In an embodiment of the present invention, metallization system 36 is a three-layer metallization system, wherein each layer is formed using sputter deposition techniques. An adhesion layer 37 is formed or sputter deposited on bottom surface 22 of semiconductor substrate 20. Suitable materials for adhesion layer 37 include a transition element selected from the periodic table group consisting of Group IVB and Group VB elements. By way of example, adhesion layer 37 is titanium having a thickness ranging between approximately 300 angstroms (Å) and 3,000 Å. Preferably, the thickness of adhesion layer 37 is 500 Å. Adhesion layer 37 promotes adhesion between semiconductor substrate 20 and subsequently formed metal layers as described hereinafter. It should be noted that the coefficient of thermal expansion of layer 37 closely matches those of subsequently formed metal layers, thus ensuring a quality mechanical and chemical bond at elevated temperatures.

A barrier layer 38 is formed on adhesion layer 37 using a sputter deposition technique. By way of example, barrier layer 38 is a mixture of nickel and vanadium having a thickness ranging between approximately 1,000 angstroms (Å) and 5,000 Å. Preferably, the thickness of barrier layer 38 is 3,000 Å. In accordance with the present invention, the concentration of vanadium in barrier layer 38 ranges between approximately 3% by weight and approximately 31% by weight. Preferably, the concentration of vanadium is approximately 7% by weight and the concentration of nickel is approximately 93% by weight. It should be understood that the percent by weight of vanadium may be less than 3% or greater than 31%. The composition of nickel and vanadium forms a barrier that inhibits the dissolution of nickel and its subsequent diffusion during solder re-flow processes.

Other suitable compositions for barrier layer 38 include a nickel alloy such as nickel-niobium (NiNb), nickel-tantalum (NiTa), nickel-sulfur (NiS), nickel-antimony (NiSb), nickel-scandium (NiSc), nickel-samarium (NiSm), nickel-tin (NiSn), nickel-magnesium (NiMg), nickel-yttrium (NiY), nickel-hafnium (NiHf), and nickel-zirconium (NiZr).

A protective layer 39 is formed on barrier layer 38 using a sputter deposition technique. Suitable materials for protective layer 39 include gold and gold alloys. By way of example, protective layer 39 has a thickness ranging between approximately 500 angstroms (Å) and 3,000 Å.

Preferably, the thickness of protective layer 39 is 1,000 Å. Protective layer 39 prevents the nickel in barrier layer 38 from becoming oxidized.

Although layers 37, 38, and 39 have been described as being formed using sputter deposition techniques, it should be understood this is not a limitation of the present invention. For example, layers 37, 38, and 39 may be formed using vacuum evaporation techniques.

Figure 3:
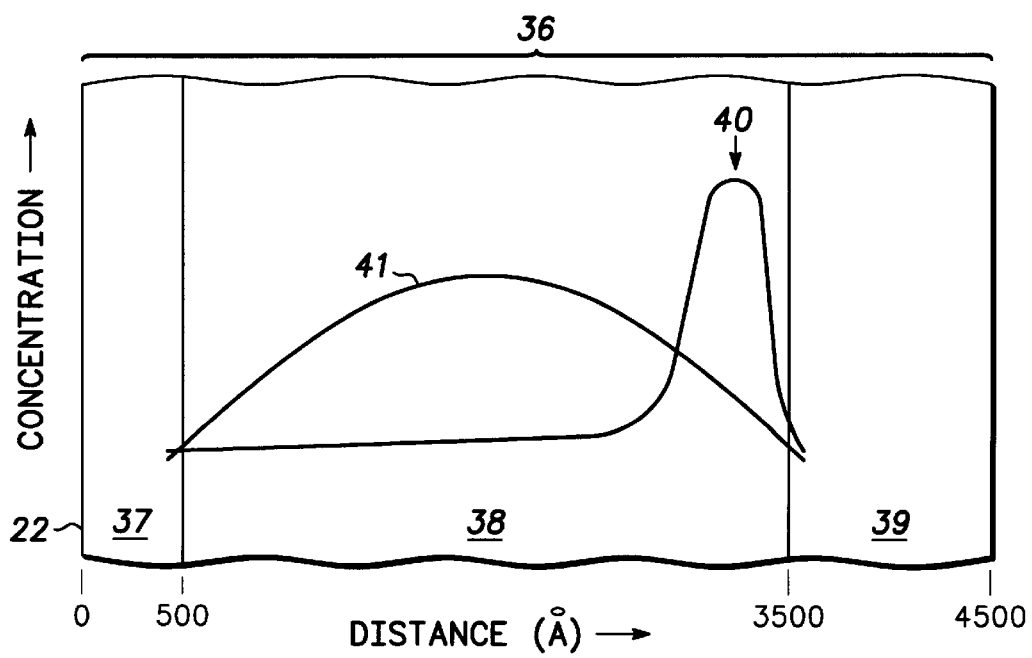
FIG. 3 is an illustration of the distribution of the metals in the metallization system of FIG. 2 after heat cycles cause redistribution of the metals in the metal alloys.

FIG. 3 is an illustration of the distribution of the metals in metallization system 36 of FIG. 2 after heat cycles cause redistribution of the metals in the metal alloys. In accordance with the present invention, metallization system 36 is a three-layer metallization system, wherein a first layer, 37, is titanium, a second layer, 38, is a combination of nickel and vanadium, and a third layer, 39, is gold. More particularly, FIG. 3 illustrates the thickness of each layer of metallization system 36 and the distribution of metals within each layer. The distance of 0 Å represents the interface between semiconductor substrate 20 and adhesion layer 37 of FIG. 2. The distance of 500 Å represents the interface between adhesion layer 37 and barrier layer 38 of FIG. 2. The distance of 3,500 Å represents the interface between barrier layer 38 and protective layer 39 of FIG. 2. The distance of 4,500 Å represents the boundary of metallization system 36 of FIG. 2 and is the interface for a solder die attach material.

Heat cycles redistribute the nickel and vanadium mixture as initially deposited in barrier layer 38, recentering the concentrations of the mixture. Heat cycles subsequent to the sputtering of the NiV mixture may be attributed to either processing steps or an assembly solder re-flow manufacturing step. The nickel concentration 41 is distributed within barrier layer 38 and has a peak concentration approximately centered within barrier layer 38. The concentration of nickel decreases near the interface between adhesion layer 37 and barrier layer 38 or the interface between barrier layer 38 and protective layer 39. The peak vanadium concentration (indicated by reference number 40) occurs near the interface between barrier layer 38 and protective layer 39. In barrier layer 38, nickel diminishes in concentration as vanadium is peaking in concentration adjacent the interface between barrier layer 38 and protective layer 39. This peak concentration or pile-up of vanadium inhibits the dissolution of nickel from barrier layer 38 into a solder used for the die attach material.

For example, the gold in protective layer 39 dissolves into the solder during the high temperatures that occur during a solder re-flow process. The barrier metals, e.g., nickel and vanadium, provide protection against solder components diffusing inward toward bottom surface 22. Typically, die having metallization system 36 are attached to copper leadframes (not shown), which are optionally plated with nickel, and then plated with either gold or silver. Examples of solders used for attaching a die from semiconductor substrate 20 to the leadframe have compositions such as 85% lead (Pb)/10% antimony (Sb)/5% tin (Sn), or 80% lead (Pb)/10% tin (Sn)/10% antimony (Sb), or 97.5% lead (Pb)/2.5% silver (Ag), or 62% tin (Sn)/36% lead (Pb)/2% silver (Ag). Metallization system 36 is bonded to the leadframe by re-flowing the solder at a temperature ranging from approximately 190° C. (Celsius) to 410° C. As the temperature cools, the solder bonds metallization system 36 to the leadframe.

By now it should be appreciated that the present invention provides a metallization system suitable for use in high temperature processes. For example, metallization system 36 is suitable for die attach processes at temperatures ranging from about 190° C. to 410° C. The metallization system is suitable for use with a wide range of solder alloys, lead frame plating materials, bonding techniques, and semiconductor substrate materials. In addition, the metallization system provides good adhesion to the substrate and has low void formation at the solder-metal system interface. It should be noted that the experimental results indicate that no substantial voids are formed. Thus, the present invention provides a system suitable for use in high temperature processes such as re-flow processes.

While specific embodiments of the present invention have been shown and described, further modifications and improvements will occur to those skilled in the art. For instance, the invention has been described in terms of a metallization system for back metal. However, it is understood that the invention is suitable for use in front metal systems. It is intended that the metallization system be patterned and used as interconnect for top surface 21 of substrate 20. For example, a substrate with the metallization system interconnecting semiconductor devices and providing top surface bonding pads could be solder bonded in a flip-chip package. The top surface metallization system provides an interstitial layer that inhibits dissolution of the interconnect metal scheme by the solder bump material.

In addition, the deposited metal system can be disposed on a leadframe for preventing interaction of a solder with the leadframe material. The leadframe material can be metal, ceramic, polymeric materials, or a combination thereof. For example, a copper lead frame is extremely reactive with Sn-based (tin-based) solder materials. The use of the metallization system, such as described herein, will inhibit copper dissolution and the formation of copper-based compounds with the solder components. The metallization system has a further advantage when the leadframe is a glass (ceramic) substrate in preventing sodium diffusion from the glass into an electronic device.

What is claimed is:

1. A structure for a metallization system, comprising:
   a substrate having a surface;
   a first layer of titanium disposed on the surface of the substrate; and
   a second layer of a nickel and vanadium composition disposed on the first layer.

2. The structure for a metallization system of claim 1, wherein the second layer is a composition of about three percent to about thirty-one percent vanadium by weight.

3. The structure for a metallization system of claim 1, further comprising a third layer disposed on the second layer.

4. The structure for a metallization system of claim 3, wherein the third layer is gold.

5. A semiconductor device, comprising:
   a semiconductor substrate having a first surface and a second surface, the first surface having a transistor formed therefrom;
   an adhesion layer of titanium disposed on at least one of the first surface and the second surface; and
   a barrier layer disposed on the adhesion layer, the barrier layer including a second layer comprised of a nickel and vanadium composition.

6. The semiconductor device of claim 5, wherein the adhesion layer is disposed on both the first surface and the second surface.

7. The semiconductor device of claim 5, wherein the semiconductor substrate is gallium arsenide.

8. The semiconductor device of claim 5, wherein the semiconductor substrate is silicon.

9. The semiconductor device of claim 5, further comprising a protective layer disposed on the barrier layer.

10. The semiconductor device of claim 8, wherein a peak vanadium concentration occurs near an interface between the barrier layer and the protective layer.

11. The structure for a metallization system of claim 1, wherein the substrate is a semiconductor.

12. The structure for a metallization system of claim 3, wherein the third layer is silver.

13. A metallization system for a leadframe, comprising:
   a first layer disposed on the leadframe;
   a second layer disposed on the first layer, the second layer including a nickel and vanadium composition.

14. The structure for a metallization system of claim 13, wherein the second layer is a composition of about three percent to about thirty-one percent vanadium by weight.

15. The structure for a metallization system of claim 13, wherein the first layer is a transition element selected from the group consisting of Group IVB and Group VB.

16. The structure for a metallization system of claim 13, further comprising a layer of gold disposed on the second layer.

17. The structure for a metallization system of claim 13, further comprising a layer of silver disposed on the second layer.

18. The structure for a metallization system of claim 13, wherein the leadframe is metal.

19. The structure for a metallization system of claim 13, wherein the leadframe is ceramic.

20. The structure for a metallization system of claim 13, wherein the leadframe is a polymeric material.

21. A metallization system for a leadframe, comprising:
   a first layer of titanium disposed on the leadframe;
   a second layer disposed on the first layer, the second layer including a nickel and vanadium composition.

22. The structure for a metallization system of claim 21, wherein the second layer is a composition of about three percent to about thirty-one percent vanadium by weight.

23. The structure for a metallization system of claim 21, further comprising a layer of gold disposed on the second layer.

24. The structure for a metallization system of claim 21, further comprising a layer of silver disposed on the second layer.

25. The structure for a metallization system of claim 21, wherein the leadframe is metal.

26. The structure for a metallization system of claim 21, wherein the leadframe is ceramic.

27. The structure for a metallization system of claim 21, wherein the leadframe is a polymeric material.

* * * * *